United States Patent
Zenpo

(10) Patent No.: US 6,533,530 B1
(45) Date of Patent: Mar. 18, 2003

(54) WAFER TRANSFERRING ROBOT

(75) Inventor: Hideharu Zenpo, Kitakyushu (JP)

(73) Assignee: Kabushiki Kaisha Yasakawa Denki, Kitakyushu (JP)

( * ) Notice: Subject to any disclaimer, the term of this patent is extended or adjusted under 35 U.S.C. 154(b) by 0 days.

(21) Appl. No.: 09/582,438

(22) PCT Filed: Jun. 30, 1998

(86) PCT No.: PCT/JP98/02933

§ 371 (c)(1), (2), (4) Date: Jun. 26, 2000

(87) PCT Pub. No.: WO99/34437

PCT Pub. Date: Jul. 8, 1999

(30) Foreign Application Priority Data

Dec. 24, 1997 (JP) ............................................. 9-367097

(51) Int. Cl.[7] .............................................. B66C 23/00
(52) U.S. Cl. ................................ 414/744.5; 414/744.6; 414/749.1; 414/752.1; 901/15
(58) Field of Search ........................... 414/744.5, 744.6, 414/749.1, 752.1; 901/15

(56) References Cited

U.S. PATENT DOCUMENTS

| | | | | |
|---|---|---|---|---|
| 5,064,340 A | * | 11/1991 | Genov et al. | 414/744.5 |
| 5,397,212 A | * | 3/1995 | Watanabe et al. | 310/90.5 |
| 5,421,695 A | * | 6/1995 | Kimura | 414/744.5 |
| 5,460,478 A | * | 10/1995 | Akimoto et al. | 414/786 |
| 5,564,889 A | * | 10/1996 | Araki | 414/222.01 |
| 5,647,724 A | * | 7/1997 | Davis et al. | 414/744.5 |
| 5,725,352 A | * | 3/1998 | Tanaka | 414/744.5 |
| 5,733,096 A | * | 3/1998 | Van Doren et al. | 414/744.3 |
| 5,879,127 A | * | 3/1999 | Grunes et al. | 414/744.6 |
| 5,975,834 A | * | 11/1999 | Ogawa et al. | 414/744.5 |
| 6,062,099 A | * | 5/2000 | Suwa et al. | 74/490.01 |
| 6,099,238 A | * | 8/2000 | Tsubota | 414/744.5 |
| 6,102,649 A | * | 8/2000 | Ogawa et al. | 414/744.5 |
| 6,109,860 A | * | 8/2000 | Ogawa et al. | 414/744.5 |
| 6,132,165 A | * | 10/2000 | Carducci | 414/744.5 |
| 6,155,131 A | * | 12/2000 | Suwa et al. | 74/490.05 |
| 6,339,969 B1 | * | 1/2002 | Salcudean et al. | 74/490.01 |
| 6,364,599 B1 | * | 4/2002 | Suwa et al. | 414/222.01 |
| 6,371,713 B1 | * | 4/2002 | Nishimura et al. | 414/222.13 |

FOREIGN PATENT DOCUMENTS

| | | | |
|---|---|---|---|
| JP | 4-264748 | 9/1992 | |
| JP | 5-74699 | 3/1993 | |
| JP | 5-109866 | 4/1993 | |
| JP | 6-338554 | * 12/1994 | ........... H01L/21/68 |
| JP | 7-171778 | * 7/1995 | ............... B25J/9/06 |
| JP | 8-306759 | 11/1996 | |
| JP | 9-102526 | 4/1997 | |
| WO | WO97/27977 | * 8/1997 | ............... 74/490.01 |

* cited by examiner

Primary Examiner—Christopher P. Ellis
Assistant Examiner—Jeffery A. Shapiro
(74) Attorney, Agent, or Firm—Armstrong, Westerman & Hattori, LLP

(57) ABSTRACT

A wafer transferring robot capable of restraining the vibration of wafers during the transfer. The robot comprises a rotating base (2) rotatable on a base (1), two horizontally extensible robot arms (3A, 3B) arranged laterally symmetrically to each other on the rotating base (2) and comprising first arms (32A, 32B), second arms (33A, 33B), and third arms (34A, 34B), respectively, and chucks (4A, 4B), fixed to the third arms (34A, 34B), respectively; wherein the lower surface of the second arm (33B) of one robot arm (3B) is higher than the upper surface of the wafer (WA) held over the third arm (34A) of the other robot arm (3A) via the chuck. Accordingly, the rigidity of transferring parts can be so enhanced that the vibration of wafers (WA, WB) can be prevented.

1 Claim, 7 Drawing Sheets

WAFER TRANSFERRING ROBOT

TECHNICAL FIELD

The present invention relates to a wafer transferring robot for transferring wafers such as semiconductor wafers.

BACKGROUND ART

Priorly, a wafer transferring robot is, for example, as shown in FIG. 13, provided with a rotating base 20 supported so as to be rotatable on a base 10, and two robot arms 30A and 30B are arranged laterally symmetrically on the rotating base 20. Robot arms 30A and 301 are provided with first arms 320A and 320B supported so that one end of each is driven to rotate by the driving motors 310A and 310B; on the other ends of the first arms 320A and 320B, one end of each of the second arms 330A and 330B are supported so as to be driven to rotate; on the other ends of the second arms 330A and 330B, one end of each of the third arms 340A and 340B are supported so as to be driven to rotate; and on the other ends of the third arms 340A and 340B, chucks 40A and 40B for holding a wafer W are provided, respectively.

Herein, when the first arms 320A and 320B, second arms 330A and 330B, and third arms 340A and 340B rotate and chucks 40A and 40B are distant from the rotating base 20 by a predetermined distance, in order to prevent interference between chucks 40A and 40B, a robot is disclosed (for example, in Japanese Laid-open Patent Publication No. 274140 of 1996) wherein one of the third arms 340A and 340B is formed in a U-shaped and whereby the chucks 40A and 40B are separated in the vertical direction.

In the abovementioned prior art, since the first arms 320A and 320B and second arms 330A and 330B are mounted with the third arms 340A and 340B and chucks 40A and 40B, enhanced rigidity is necessary. However, since the third arms 340A and 340B do not necessitate great rigidity, and in order to improve operation properties by reducing inertia, it is necessary to configure them so as to have relatively smaller rigidity.

Also, there is another problem in that, when the third arms 340A and 340B have improved rigidity, since form dimensions enlarge and weight increases, the capacity of the arm driving motors has to be increased.

DISCLOSURE OF INVENTION

The object of the present invention is to provide a wafer transferring robot capable of restraining the vibration; of wafers during the transfer without increasing rigidity of third arms.

According to the present invention, a wafer transferring robot comprises a rotating base arranged so as to rotate l.on a base, two horizontally extensible robot arms arranged laterally symmetrically to each other on the rotating base and comprising first arms, second arms, and third arms respectively, and chucks fixed to the third arms, respectively; wherein the linear movable devices consist of linear motors, wherein mobile elements fixed, so as to be vertically erect, to transferring parts arranged so as to be vertically erect and stators fixed, so as to be perpendicularly erect, on the rotating base are arranged so as to be horizontally opposed, and besides, in one robot arm, the third arm is over the second arm, and the third arm of the other robot arm is below the second arm so as to be opposed to the third arm of said former robot arm.

Furthermore, the wafer transferring robot comprising a rotating base arranged so as to rotate on a fixed base, linear movable devices horizontally extended on the rotating base, holding parts fixed to transferring parts of the linear movable devices, and chucks fixed to the holding parts; wherein the linear movable devices consist of linear motors, wherein mobile elements fixed, so as to be vertically erect, to transferring parts arranged so as to be vertically erect and stator fixed, so as to be perpendicularly erect, on the rotating base are arranged so as to be horizontally opposed, and besides, the plurality of linear motors horizontally arranged in parallel to each other, and the holding parts are arranged at places where wafers held by the chucks do not interfere with each other, respectively.

Furthermore, the linear movable devices comprise linear motors for driving the transferring parts.

Furthermore, the linear movable devices comprise belt movable devices for driving the transferring parts.

Furthermore, the linear movable devices comprise cylinders for driving the transferring parts.

Furthermore, the linear movable devices are horizontally arranged side by side on the rotating base.

Furthermore, the linear movable devices are vertically arranged to be stacked up on the rotating base.

Accordingly, without increasing rigidity of the third arms the rigidity of the transferring parts can be so enhanced that: the vibration of wafers WA and WB can be prevented.

As described above, the following effects are provided according to the present invention, (1) Since the chucks are supported by the linear movable devices having configurations with high rigidity, the vibration of wafers during transfer can be prevented, (2) Since the linear movable devices consist of linear motors wherein movable elements and stators are arranged to be horizontally opposed, and the plurality of linear motors are horizontally arranged in parallel to each other, a great number of wafers can be transferred at the same time and a high quality wafer transferring robot, which can deal with and a plurality of compact processing operations and restrain vibration, can be provided.

BEST MODE FOR CARRYING OUT THE INVENTION

Hereinafter, preferred embodiments of the present invention are described with reference to the drawings.

Figure 1:
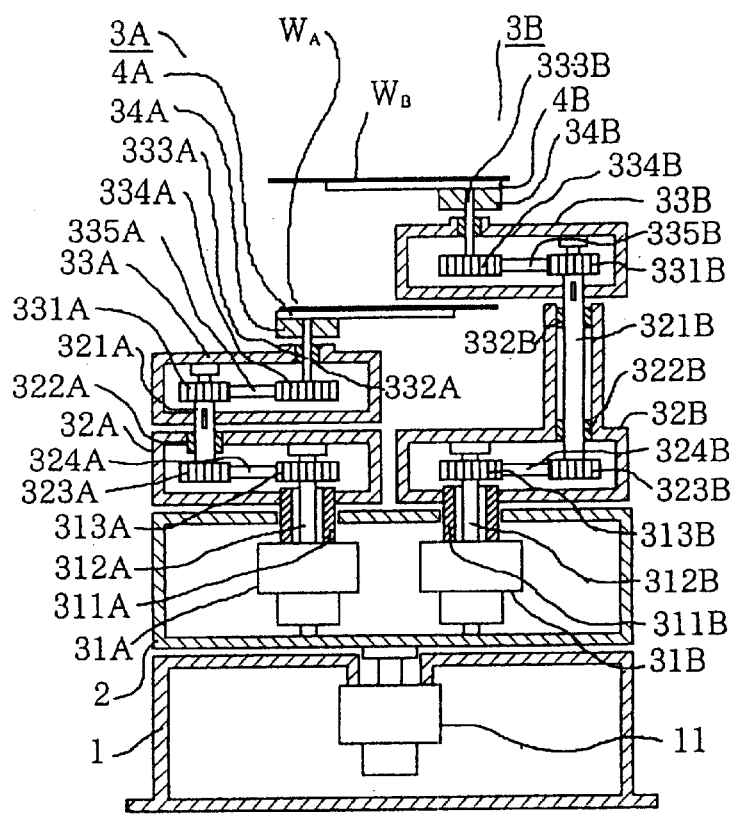
FIG. 1 is a frontal sectional view showing a first embodiment of the present invention.
Figure 2:
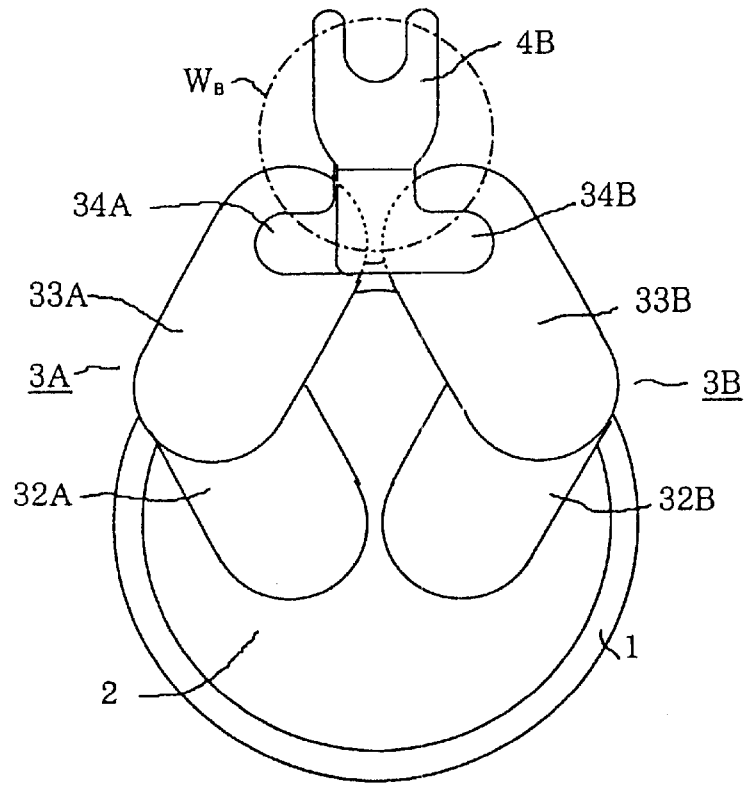
FIG. 2 is a plan view showing a first embodiment of the present invention.

FIG. 1 is a frontal sectional view showing a first embodiment of the present invention and FIG. 2 is a plan thereof.

In the drawings, 1 is a base, 2 is a rotating base supported on the fixed base so as to be rotatable by a driving motor, 3A and 3B are two multi-joint type robot arms as linear movable devices whose tip ends are made linearly movable, and which are horizontally extensible, respectively, and arranged so as to be laterally symmetrical on the rotating base 2. 31A and 31B are driving motors which are fixed to the rotating base 2 apart and have hollow shafts 311A and 311B protruding over the rotary base 2, respectively. 312A and 312B are fixed shafts which penetrate through the driving motors 31A and 31B and are fixed to the rotating base 2, and to which pulleys 313A and 313B are fixed.

32A and 32B are first arms in which one end of each is supported so as to be driven to rotate in a horizontal plane by the hollow arms 311A and 311B of the driving motor 31A and 31B. 321A and 321B are first pivots supported on the other ends of the first arms 32A and 32B via bearings 322A and 322B, pulleys 323A and 323B are disposed on the side of the first arms 32A and 32B, and belts 324A and 324B are wound and fitted between the pulleys 323A and 323B and pulleys 323A and 323B constituting transferring parts. The bearing 322B portion and first pivot 321B of one first arm 32B are longer than the bearing 322A portion and first pivot 321A of the other first arm 32A.

33A and 33B are second arms, one end of each is fixed to the first pivots 321A and 321B, and on the side of the second arms 33A and 33B of the first pivots 321A and 321B, pulleys 331A and 331B are fixed. 333A and 333B are second pivots supported on the other ends of the second arms 33A and 33B via bearings 332A and 332B and pulleys 334A and 334B are fixed on the side of the second arms 33A and 33B. 335A and 335B are belts wound and fitted between the pulleys 331A and 331B and pulleys 334A and 334B. 34A and 34B are third arms and one end of each is fixed to the second pivots 333A and 333B. 4A and 4B are chucks holding wafers WA and WB and fixed to the third arms 34A and 34B, respectively.

Furthermore, the lower surface of the second arm 33B is higher than the upper surface of the wafer WA held by the chuck 4A so that the wafer WA held by the chuck 4A and the wafer WB held by the chuck 4B do not interfere with each other.

According to such a configuration, by driving the driving motors 31A and 31B, the first arms 32A and 32B and second arms 33A and 33B are rotated, the third arms 34A and 34B are horizontally moved, the wafers WA and WB held by the chucks 4A and 4B can be transferred.

In this case, since the second arm 33B with high rigidity is higher than the wafer WA held by the chuck 4A disposed on the third arm 34A, to configure the third arm 34B so as to avoid interference between wafers WA and WB is unnecessary, and thus the configuration of the third arm 34B is simplified and the rigidity of the transferring parts can be enhanced so that vibration of the wafers WA and WB during the transfer can be prevented.

Figure 3:
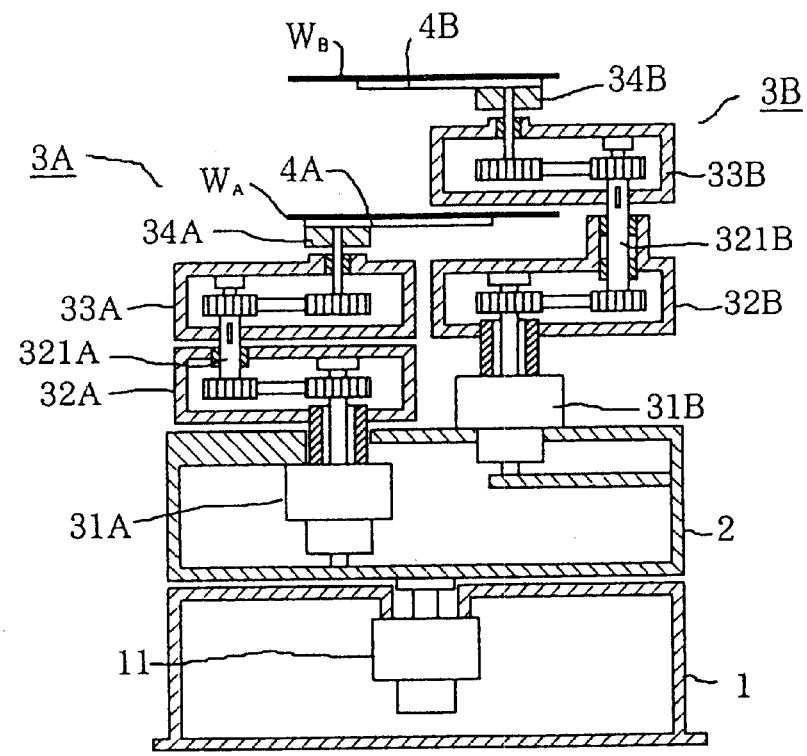
FIG. 3 is a frontal sectional view showing a second embodiment of the present invention.

FIG. 3 is a frontal section showing a second embodiment of the present invention.

In a second embodiment, the driving motor 31B is placed over the rotating base 2, the first arm 32B is placed at the same height as the second arm 33A, the lower surface of the second arm 33B is placed higher than the upper surface of the wafer WA held by the chuck 4A so that the wafer WA held by the chuck 4A and the wafer WB held by the chuck 4B do not interfere with each other.

According to such a configuration, the length of the first pivot 321B can be shortened, thus the rigidity of the first arm 32B can be enhanced.

Figure 4:
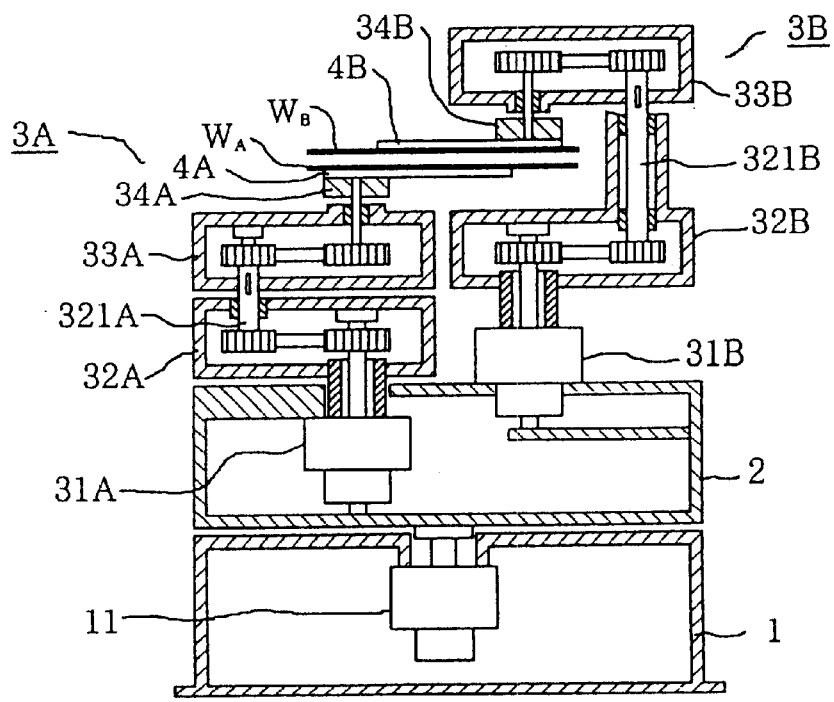
FIG. 4 is a frontal sectional view showing a third embodiment of the present invention.

FIG. 4 is a frontal section showing a third embodiment of the present invention.

In the above second embodiment, an example where the third arms 34A and 34B are disposed over the second arms 33A and 33B, whereas in a third embodiment, the second pivots 333A and 333B are protruded below the second arms 33A and 33B and the third arms 34A and 34B are disposed below the second arms 33A and 33B.

In this case, two wafers WA and WB can be brought closer together.

Figure 5:
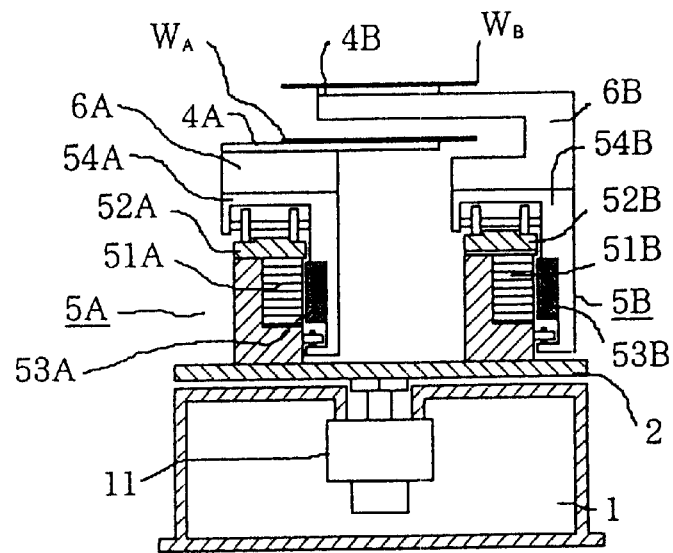
FIG. 5 is a frontal sectional view showing a fourth embodiment of the present invention.
Figure 6:
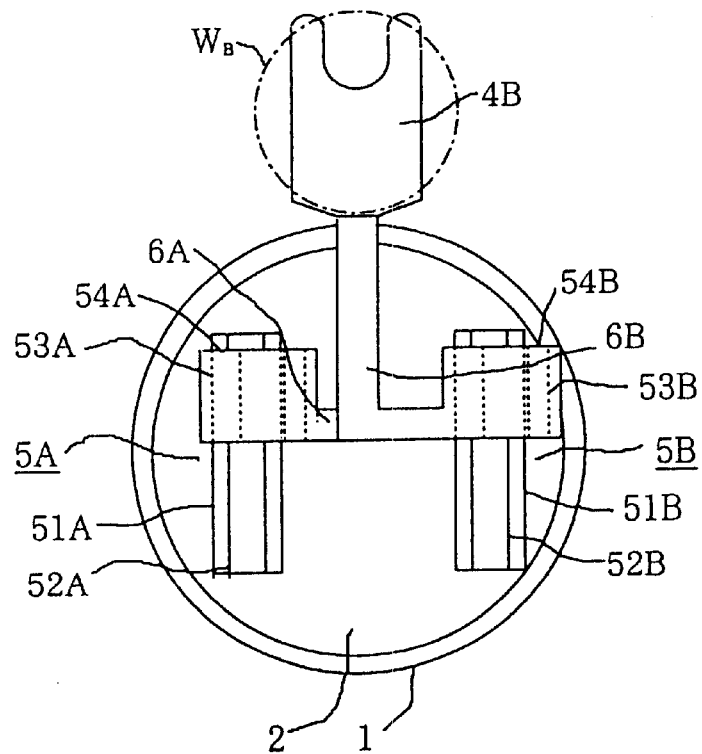
FIG. 6 is a plan view showing a fourth embodiment of the present invention.

FIG. 5 is a frontal section showing a fourth embodiment of the present invention and FIG. 6 is a plan thereof.

In a fourth embodiment, in place of the multi-joint type robot arms as described in the first embodiment, linear motors are utilized as linear movable devices.

That is, 5A and 5B are two linear motors which are fixed on the upper surface of the rotating base 2 and horizontally extended parallel to each other, 51A and 51B are stators, 52A and 52B are guide rails extended along the longitudinal direction of the stators 51A and 51B, 53A and 53B are mobile horizontally opposed to the stators 51A and 51B with a gap between them. 54A and 54B are transferring parts fixed to the mobile elements 53A and 53B and made movable along the guide rails 52A and 52B. 6A and 6B are holding parts fixed to: the transferring parts 54A and 54B and to which chucks 4A and 4B are fixed, respectively.

The stators 51A and 51B, movable elements 53A and 53B, and transferring parts 54A and 54B are arranged so as to tilt at 90° and become vertically erect.

Herein, the holding part 6B is formed in an approximate U-shape so that the wafers WA and WB overlap with each other with clearance in the vertical direction, and thus the wafers WA and WB do not interfere with each other.

According to such a configuration, by driving the linear motors 5A and 5B, the wafers WA and WB held by the chucks 4A and 4B can be moved.

In this case, since the configurations of the transferring parts 54A and 54B and holding parts 6A and 6B can be simplified, the rigidity of the transferring parts can be easily enhanced, and thus vibration of the wafer WA and WB during the transfer can be prevented.

Figure 7:
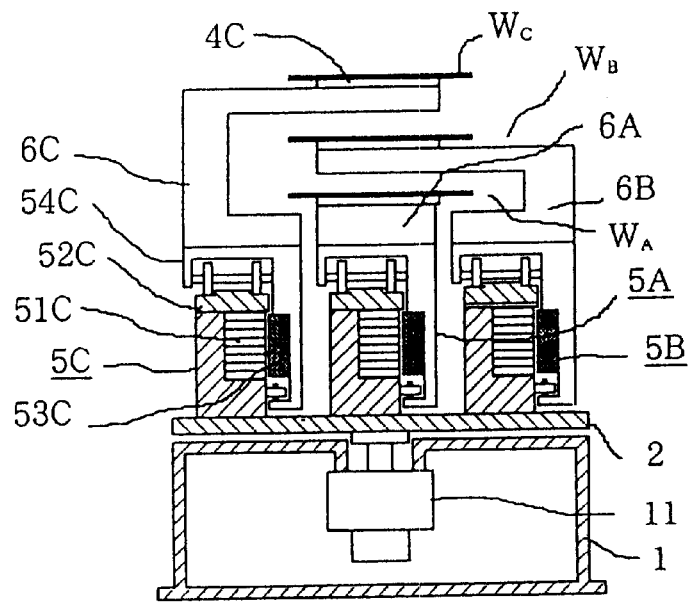
FIG. 7 is a frontal sectional view showing a fifth embodiment of the present invention.
Figure 8:
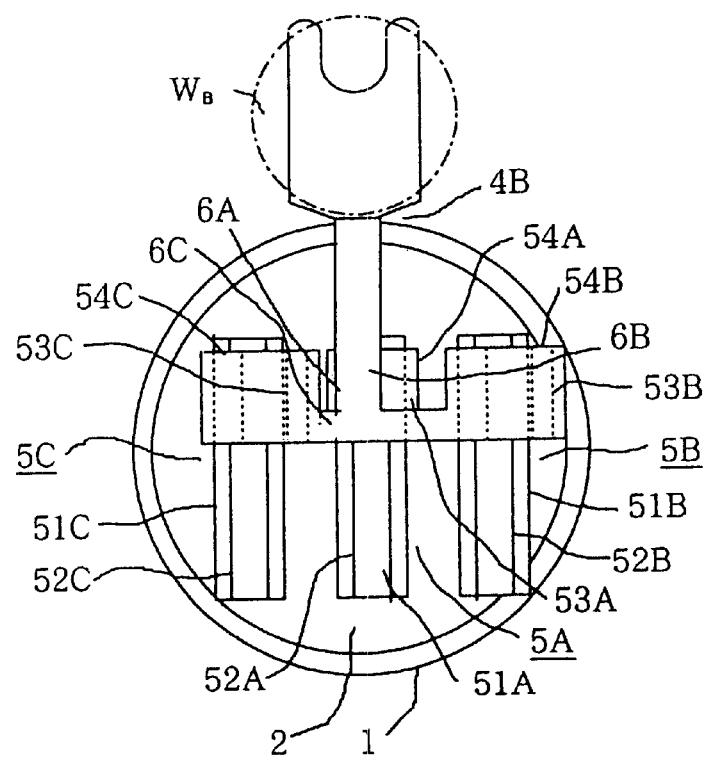
FIG. 8 is a plan view showing a fifth embodiment of the present invention.

FIG. 7 is a frontal section showing a fifth embodiment of the present invention and FIG. 8 is a plan thereof.

In a fifth embodiment, three linear motors described in the fourth embodiment are used.

That is, 5A, 5B, and 5C are three linear motors which are fixed on the upper surface of the rotating base 2 and horizontally extended parallel to each other , 51A, 51B and 51C are stators, 52A, 52B, and 52C are guide rails extended along the longitudinal direction of the stators 51A, 51B, and 51C, and 53A, 53B, and 53C are mobile elements opposed to the stators 51A, 51B, and 51C with a gap between them.

54A, 54B, and 54C are transferring parts fixed to the mobile elements 53A, 53B, and 53C and made movable along the guide rails 52A, 52B, and 52C. 6A, 6B, and 6C are holding parts fixed to the transferring parts 54A, 54B, and 54C and to which chucks 4A, 4B, and 4C, are fixed, respectively.

Herein, the holding parts 6B and 6C are formed in an approximate U-shape so that the wafers WA, WB, and WC held by the chucks 4A, 4B, and 4C overlap with each other with space in the vertical direction, and thus the wafers WA, WB, and WC do not interfere with each other.

According to such a configuration, by driving the linear motors 5A, 5B, and 5C, the wafers WA, WB, and WC held by the chucks 4A, 4B, and 4C can be moved.

In this case, since the configurations of the transferring parts 54A, 54B, and 54C and holding parts 6A, 6B, and 6C can be simplified, the rigidity of the transferring parts can be easily enhanced, as well as preventing vibration of the wafers WA, WB, and WC during the transfer.

In the above third embodiment, an example wherein three linear motors are used is described, however, if the holding parts are formed so that the wafers held by the chucks do not interfere with each other, the number is not necessarily limited to three and four motors or more can be utilized.

Accordingly, in this case, a great number of compact wafers can be transferred at the same time.

Figure 9:
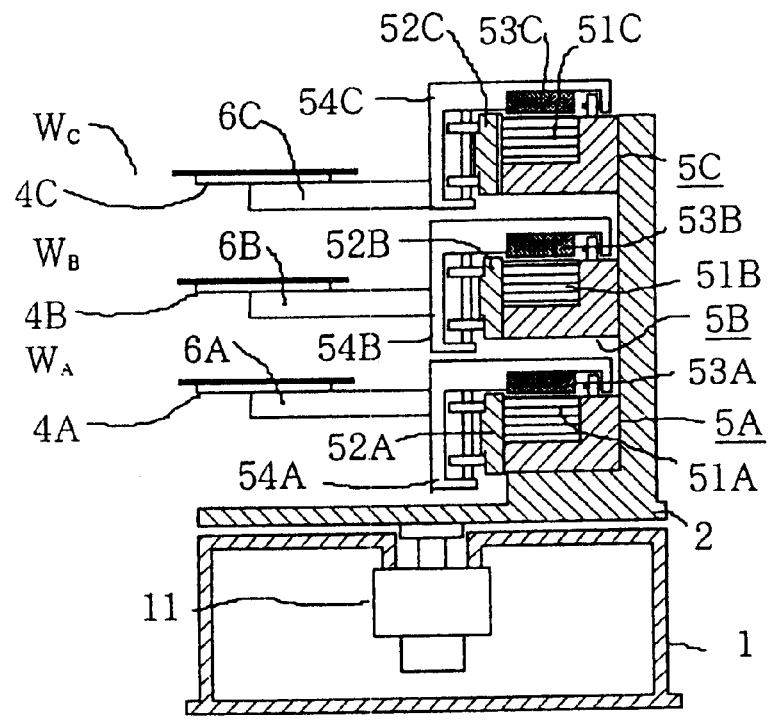
FIG. 9 is a frontal sectional view showing a sixth embodiment of the present invention.
Figure 10:
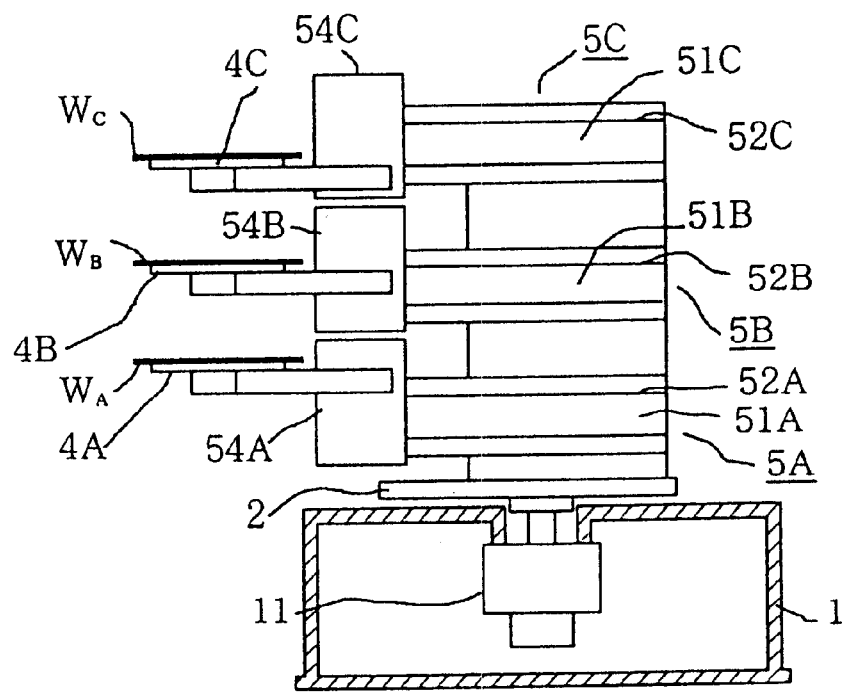
FIG. 10 is a plan view showing a sixth embodiment of the present invention.

FIG. 9 is a frontal section showing a sixth embodiment of the present invention and FIG. 10 is a side view thereof.

In the fifth embodiment, the linear motors 5A, 5B, and 5C as described in the fourth embodiment are vertically arranged to be stacked up.

Thus, the holding part 6A, 6B, and 6C can be shaped in the same rod-shape horizontally extending from the transferring parts 54A, 54B, and 54C, and whereby the rigidity of the holding parts 6A, 6B, and 6C is enhanced, as well as manufacture of the parts becomes easy.

Figure 11:
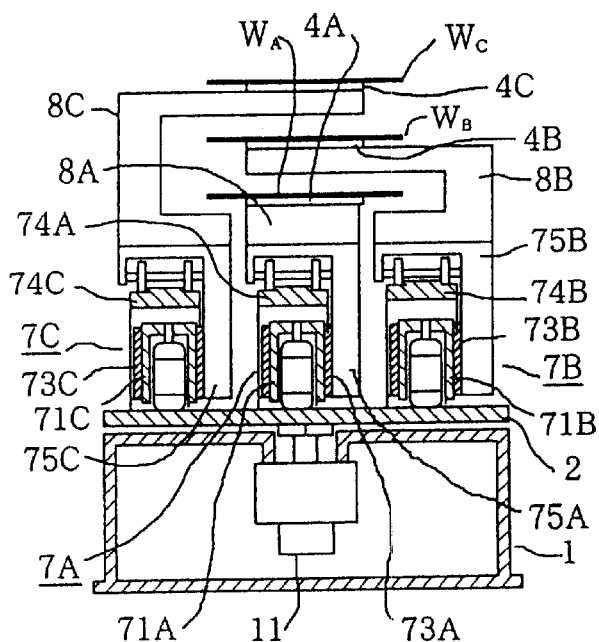
FIG. 11 is a frontal sectional view showing a seventh embodiment of the present invention.
Figure 12:
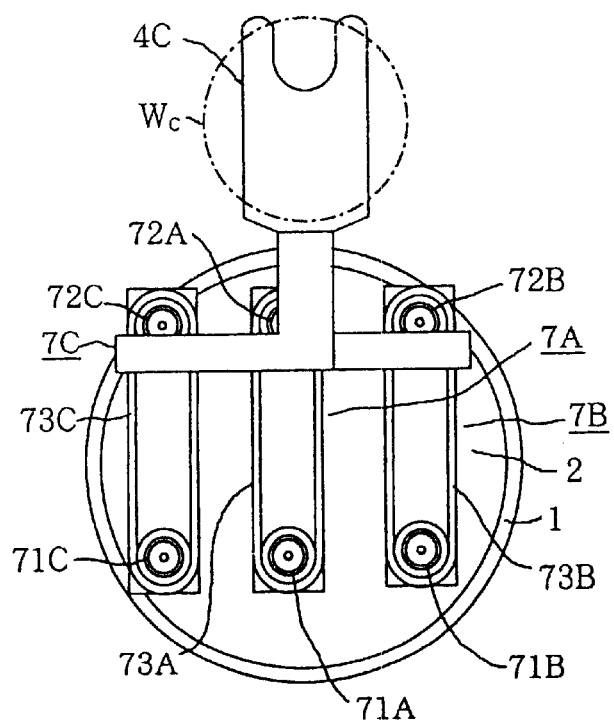
FIG. 12 is a plan view showing a seventh embodiment of the present invention.
Figure 13:
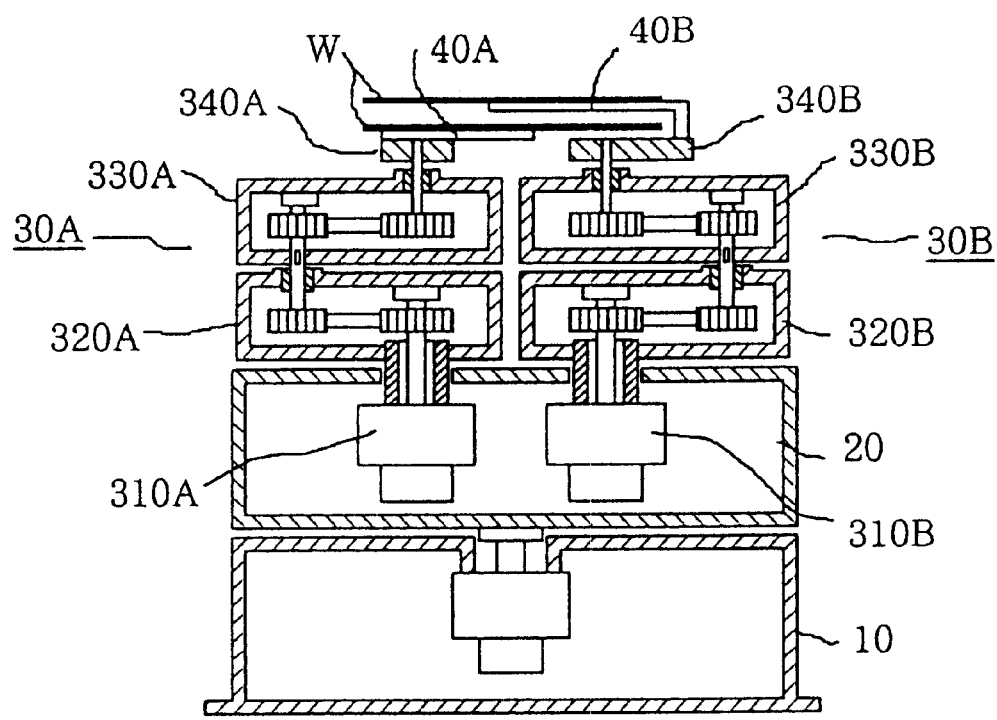
FIG. 13 is a frontal sectional view showing an example of the prior art.

FIG. 11 is a frontal section showing a seventh embodiment of the present invention and FIG. 12 is a plan thereof.

In a seventh embodiment, in place of the linear motors utilized as the linear movable devices in the fifth embodiment, timing belts are utilized.

That is, 7A, 7B, and 7C are three belt movable devices which are fixed on the upper surface of the rotating base 2 and horizontally extended parallel to each other, 71A, 71B, and 71C are pulleys with built-in motors disposed on one end of each of the belt movable devices 7A, 7B, and 7C, 72A, 72B, and 72C are pulleys disposed on the other ends of the belt movable devices 7A, 7B, and 7C, and 73A, 73B, and 73C are timing belts wound and fitted around the pulleys with built-in motors 71A, 71B, and 71C and pulleys 72A, 72B, and 72C.

74A, 74B, and 74C are guide rails extended along the longitudinal direction of the belt movable device 7A, 7B, and 7C, 75A, 75B, and 75C are transferring parts fixed to the timing belts 73A, 73B, and 73C and made movable along the guide rails 74A, 724, and 74C. 8A, 8B, and 8C are holding parts fixed to the transferring parts 75A, 75B, and 75C and to which chucks 4A, 4B, and 4C are fixed, respectively.

Herein, the holding part 8B and 8C are formed in an approximate U-shape so that the wafers WA, WB, and WC overlap with each other with space in the vertical direction, and thus the wafers WA, WB, and WC do not interfere with each other.

According to such a configuration, by driving the pulleys with built-in motors 71A, 71B, and 71C of the belt movable devices 71A, 71B, and 71C, the wafers WA, WB, and WC held by the chucks 4A, 4B, and 4C via the timing belts 73A, 73B, and 73C, transferring parts 75A, 75B, and 75C, and holding parts 8A, 8B, and 8C can be moved.

In this case, since the configurations of the transferring parts 75A, 75B, and 75C and holding parts 8A, 8B, and 6C can be simplified, the rigidity of the transferring parts can be easily enhanced, as well as preventing vibration of the wafers WA, WB, and WC during the transfer.

Furthermore, in the above seventh embodiment, an example where a plurality of belt devices are horizontally arranged side by side is described, however, the belt devices may be vertically arranged to be stacked up in the same manner as the sixth embodiment.

Moreover, in the above seventh embodiment, an example where three belt devices are utilized is described, however, if the holding parts are formed so that the wafers held by the chucks do not interfere with each other, the number is not necessarily limited to three and four belt movable devices or more can be utilized.

Accordingly, in this case, a great number of compact wafers can be transferred at the same time.

Also, the linear movable device is not limited to the linear motor and belt movable device, however, a cylinders where a piston linearly moves based on hydrodynamics may be utilized.

Industrial Applicability

The present invention is applicable in the fields for producing and providing a wafer transferring robot which transfer wafers such as semiconductor wafers.

What is claimed is:

1. A wafer transferring robot comprising:
   a fixed base,
   a rotating base mounted for rotation on said fixed base,
   a driving motor mounted on said fixed base and being operably connected to said rotating base for moving said rotating base with respect to said fixed base,
   two horizontally extensible robot arms arranged laterally symmetrically with respect to each other on the rotating base and each comprising first arm elements, second arm elements and third arm elements vertically spaced with respect to each other,
   each of said first and second arm elements being defined by hollow casing structure containing spaced pulleys fixedly attached to a pully shaft and having an interconnecting belt,
   a driving motor for driving said first arm element at one end with said driving motor,
   a bearing at the other end of said first arm element receiving a pully fixed to a first pivot interconnecting said first and second arm elements, said pivot attaching fixed pulleys at ends thereof disposed in said first and second arm elements respectively,
   a bearing in said second arm element for receiving a second pivot having a pully in said second arm element and having a belt therein interconnecting said pulleys,
   third arm elements vertically spaced above said second arm element and carrying a wafer-bearing chuck,
   wherein the second arm element in one robot arm is disposed at a height greater than the second arm element in the other robot arm to dispose said third arm element of said other robot arm below, and in opposition to, the second arm element of said one robot arm.

* * * * *